United States Patent [19]

Dunsirn

[11] Patent Number: 4,653,369
[45] Date of Patent: Mar. 31, 1987

[54] FLEXOGRAPHIC PRINTING PLATE MOUNTING METHOD AND APPARATUS

[75] Inventor: Duane R. Dunsirn, Neenah, Wis.

[73] Assignee: Menasha Corporation, Neenah, Wis.

[21] Appl. No.: 628,722

[22] Filed: Jul. 9, 1984

[51] Int. Cl.⁴ ............................................. B26D 7/01
[52] U.S. Cl. ................................ 83/411 R; 83/467 R; 83/520; 83/618
[58] Field of Search ............ 83/33, 36, 467 R, 411 R, 83/520, 521, 618

[56] References Cited

U.S. PATENT DOCUMENTS

| | | | |
|---|---|---|---|
| 3,198,047 | 8/1965 | Munz | 83/520 X |
| 3,763,730 | 10/1973 | Ahlegian | 83/520 X |
| 3,906,826 | 9/1975 | Middendorf | 83/411 R X |
| 4,086,836 | 5/1978 | Jensen et al. | 83/521 |
| 4,380,946 | 4/1983 | Mayston | 83/521 |

OTHER PUBLICATIONS

Brochure entitled "Mounting and Proofing", published by the Foundation of Flexographic Technical Association, Inc.
Advertising sheet entitled "Mosstype and Optical Mounter-Proofer", published by Mosstype Corporation, Waldwick, New Jersey.

*Primary Examiner*—James M. Meister
*Assistant Examiner*—John L. Knoble
*Attorney, Agent, or Firm*—Isaksen, Lathrop, Esch, Hart & Clark

[57] ABSTRACT

A flexographic printing plate (80) having register marks (82) thereon is supported on the surface (16) of a support table (15) which is capable of being rotated about a central vertical axis. The register marks are viewed by an optical viewer television camera (84) and displayed on a video screen (28) on which are also projected sight marks (86, 87). The operator adjusts the rotational position of the table until the register marks on the plate align with the sight marks. The plate is then punched using a punch unit (24) to form a series of holes (89) in the plate (80) which defines a line either parallel or perpendicular to the axis of the images (81) on the plate. The punched plate is then laid on the top surface of a mounting table (91) of a mounting unit (90) and pins (93) are inserted through the holes in the plate into holes (92) in the table surface. A portion of the plate is adhered to the surface of the plate cylinder, the pins (93) are removed, and the arbor (96) is rotated to draw the plate off of the mounting surface onto the plate cylinder while a pressure roller (145) presses against the plate on the mounting table to prevent it from changing its orientation as it is drawn onto the plate cylinder surface.

19 Claims, 11 Drawing Figures

FLEXOGRAPHIC PRINTING PLATE MOUNTING METHOD AND APPARATUS

BACKGROUND OF THE INVENTION

1. Technical Field

This invention relates generally to the field of flexographic printing equipment and particularly to methods and apparatus for mounting flexographic plates to the plate cylinders.

2. Background Art

The flexographic printing process utilizes an elastomeric printing plate which generally has raised or letterpress printing features. The plates may be made of various materials, including natural and synthetic rubbers, plastics and photopolymer plastic. The finished flexographic plate is mounted to the surface of a plate cylinder in various ways, and printing is generally accomplished in the letterpress manner by passing the paper or other substrate to be printed through the nip between the plate cylinder and a backup or impression cylinder.

In many modern printing applications, particularly where multiple printing images are formed on a single plate, and in multicolor printing, the precision with which the plate is mounted to the cylinder is critical to successful printing. Proper alignment of multiple images formed on a single plate will allow each image to be printed at its proper location on the substrate, a particularly significant factor when printing is performed upon relatively small substrates such as tags and labels. Highly accurate mounting of the plates is also essential in multi-color printing wherein several plates on separate plate cylinders are used to lay down the various colors on the substrate in sequence. The image impressed by each plate in its turn upon the substrate must be precisely registered with the previously printed images to avoid overlap of the images or mixing of the inks.

To aid in the proper mounting of flexographic plates, scribe lines or register marks are generally formed on the face of the plate outside of the image area which are parallel to the "vertical" and "horizontal" axes of the image or images on the plate. In simple plate mounting procedures, adequate for one color jobs, a pressman can mount the plates by lining up the scribe marks with horizontal and circumferential lines scratched on the surface of the plate cylinder. Final adjustment of the printing images on two separate plate cylinders in two color printing can then sometimes be accomplished with the cylinders mounted on the press by moving the two cylinders sideways and circumferentially with respect to one another until the printed images on sample runs are in registry. However, such simple mounting procedures are totally inadequate for three and four color printing or for printing with plates bearing multiple designs. Errors and inaccuracies in the mounting of the plates is costly to correct because of the machine down-time and the attention required by highly skilled pressmen to obtain the desired alignment of the images.

To minimize the amount of on-press time required to accurately align images printed by plates which had been inaccurately mounted, various machines have been developed and are being commercially used to allow more accurate mounting of the plate to the cylinder. However, considerable skill is required on the part of the machine operator to properly mount plates utilizing such machines, and the process of mounting is often time consuming and subject to human error.

SUMMARY OF THE INVENTION

In accordance with the present invention, a flexographic printing plate can be mounted to a plate cylinder with a procedure requiring a minimum of training and skill on the part of the operator while yielding a highly accurate alignment of the images on the plate with respect to the plate cylinder. Less operator time is generally required to prepare and mount a plate to the cylinder than is required utilizing present mounting apparatus and procedures, and the accuracy of mounting obtained minimizes the on-press make-ready time.

The apparatus of the invention includes a preparation table, on which a flexographic plate is punched with holes describing a line precisely aligned with the axes of the images on the plate, and a plate mounter which aligns the prepared plate to a plate cylinder and facilitates the transfer of the plate to the cylinder.

The plate preparation table includes a support table with a top surface which is mounted to a frame for rotation about an axis perpendicular to the top surface so that the support table can be adjusted to a selected rotational position with respect to the frame. An optical viewer mounted on a carriage can be moved to any position over the support table surface in a plane parallel to the surface while retaining a fixed geometric relationship to the frame. The optical viewer preferably constitutes a television camera which provides a magnified view of a small portion of the surface of the support table on which a printing plate may be mounted. The top surface is preferably translucent so that light from fixtures beneath the surface can be projected up through a plate on the table surface to facilitate viewing by the television camera. With a printing plate held in a fixed position on the table surface, the optical viewer can be positioned over registration marks formed on the plate which are parallel and perpendicular to the axes of the images on the plate. These registration marks can be viewed on a television monitor by the operator. The monitor projects orthogonal sight marks on the display screen, allowing the operator to align the sight marks with the registration marks on the plate by adjusting the rotational position of the support table with respect to the frame. A punch unit is also mounted by a carriage to the frame above the support table surface and is positioned to move into engagement with a portion of the plate along one edge and to punch a series of holes in the plate which lie along a line which is parallel to one of the axes of the images on the plate. The line of the punches in the punch unit is geometrically fixed with respect to the optical viewer so that the reference lines on the visual display which the observer sees superimposed on the plate are effectively parallel to the line of the holes punched by the punch unit.

A plate mounting unit is then used to mount the punched plate in proper alignment to a plate cylinder. The mounting unit includes a mounting table having a flat top surface with a rectangular array of regularly spaced holes formed therein. The punched plate is laid on the top of the mounting table and is secured in proper position to the top of the table by two or more register pins which are passed through the holes in the plate into the holes in the mounting table. Both the register pins and the holes into which they are received are preferably tapered to allow the pins to be firmly held within the holes and precisely positioned. By so mounting the plate to the table, the holes in the plate are therefore precisely aligned with the line of holes in the table. A small pressure roller is then preferably engaged to the plate to hold it in position when the pins are removed and as the plate is drawn from the table. An arbor having chucks engageable to the two ends of the plate cylinder is adapted to hold the plate cylinder for rotation in a position adjacent the front edge of the mounting table such that the axis of rotation of the plate cylinder is parallel to the rows of holes on the mounting table; therefore, any circumferential track on the surface of the cylinder will be parallel to the columns of holes in the mounting table. A plate affixed to the mounting table by the register pins will have the axis of images thereon aligned with a circumferential track on the plate cylinder surface. The arbor is mounted to allow the plate cylinder surface to be moved closer to or farther from the front edge of the mounting table, and the mounting table itself is mounted for lateral motion parallel to the rotational axis of the plate cylinder such that the center of the plate may be substantially aligned with the center of the plate cylinder. However, the rows and columns of holes in the mounting table always remain parallel and perpendicular, respectively, to the rotational axis of the plate cylinder during such motions of the arbor and of the mounting table.

The plate is positioned on the mounting table with a portion thereof overhanging the front edge of the table and extending over a portion of the surface of the plate cylinder. The plate, when thus properly aligned with the cylinder, may be attached to the cylinder in various ways. For example, double-sided adhesive paper from a roll mounted below the plate cylinder arbor may be applied to the surface of the plate cylinder. The backing is then removed from the double-sided adhesive paper, the overhanging portion of the plate is secured to the adhesive paper on the cylinder surface, and the register pins are removed from the plate and mounting table. The arbor and plate cylinder may then be rotated by the operator to pull the plate from the mounting table onto the surface of the cylinder in a precise track such that the axis of the images on the plate remains always parallel to a circumferential track on the surface of the plate cylinder. The mounting unit preferably includes a pressure roller which can be utilized to press the plate against the adhesive paper on the cylinder as the cylinder is rotated to facilitate adhesion of the plate to the cylinder surface. After the plate is fully drawn from the mounting table to the plate cylinder, any overlapping portions of the plate on the cylinder may be severed by the operator so that the ends of the plate substantially mate with one another. With the plate now mounted in proper alignment on the surface of the plate cylinder, the operator may remove the cylinder from the chucks in the arbor and place the cylinder in its position on the printing press. The holes that have been punched in the plate are located at a position outside of the image area of the plate and cause no interference with the printing operation.

Further objects, features and advantages of the invention will be apparent from the following detailed description when taken in conjunction with the accompanying drawings showing a preferred embodiment in accordance with the invention.

BEST MODE FOR CARRYING OUT THE INVENTION

Figure 1:
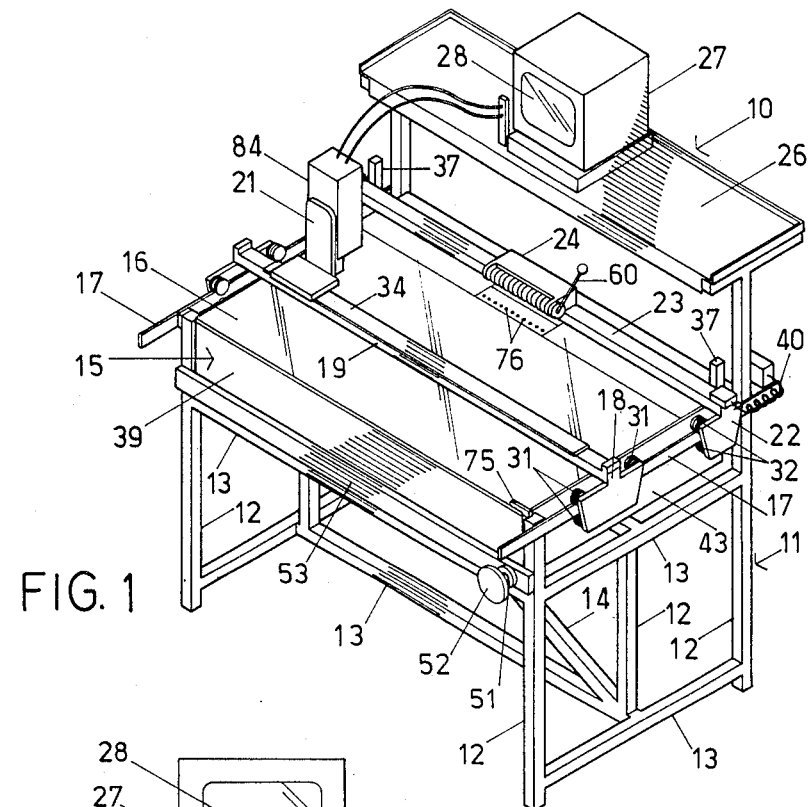
FIG. 1 is an isometric perspective view of the preparation table unit portion of the invention.

With reference to the drawings, a plate preparation table unit is shown in perspective view generally at 10 in FIG. 1. The unit at 10 has a support frame 11 which is suited to sit in a level position on the floor and is composed of upright metal posts 12, horizontal connecting members 13 and cross braces 14. A rectangular, box-like support table 15 is mounted to the frame 11 in a manner which will be described in further detail below, and has a flat top surface 16 which is preferably formed of a translucent material such as frosted glass or plexiglass. Horizontal rails 17 are mounted to the uprights 12 of the frame 11 at positions to the side of the support table 15. An optical viewer carriage 18 is mounted to slide backwards and forwards on the rail 17 and has a cross bar 19 held above the surface of the table 16 which supports an optical viewer 21, e.g., a television camera, for sliding movement from side to side thereon. A punch unit support carriage 22 is also mounted to the rails 17 for movement backwards and forwards thereon and has a cross bar 23 which supports a punch unit 24 at a fixed position on the cross bar. The plate preparation unit 10 also preferably has a shelf 26 mounted to two of the uprights 12 at a position above the support table which can be used to support a video display unit 27 at a position wherein its screen 28 is visible to an operator.

Figure 2:
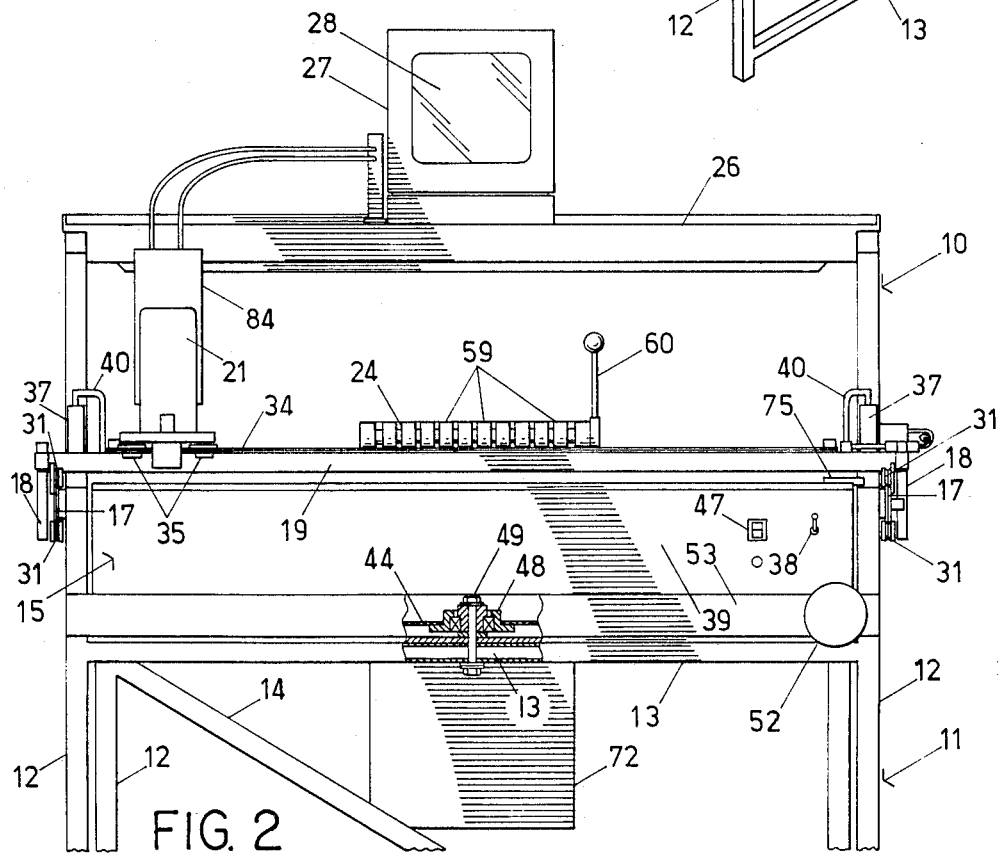
FIG. 2 is a front elevational view of the preparation table unit of FIG. 1.

The two elongated side rails 17 are mounted to the frame 11 at the same height and parallel to one another and lie with their elongated edges parallel to the plane defined by the top surface 16 of the support table 15. The carriages 18 and 22 which mount the optical viewer 21 and the punch unit 24, respectively, are mounted to be movable backwards and forwards on the rails 17 but with the cross bars 19 and 23 always remaining parallel to one another and parallel to the plane of the surface 16 of the support table. As best shown in FIG. 2, the carriage 18 has four spaced grooved rollers 31 engaging the top and bottom of each rail 17 to firmly hold the carriage in position on the rails. Similar grooved rollers 32 mount the punch unit carriage 22 to the side rails 17. A horizontally disposed elongated rail 34 is attached to the top of the cross bar 19 and a set of four horizontally aligned, grooved rollers 35 mount the optical viewer unit 21 to the rail 34 to allow sliding back and forth movement thereon. The carriage 22 supporting the punch unit 24 above the surface 16 of the support table can be held firmly in a selected position by activation of air cylinders 37 mounted to the cross bar 23 at positions just above one of the horizontal support members 13. The air cylinders 37 are activated by the operator by throwing a switch 38 on the front panel 39 of the support table to supply air through hoses 40 to cause the air cylinders 37 to drive a plunger (not shown) into firm engagement with a horizontal support block (not shown) on the rails 17 beneath it.

Figure 3:
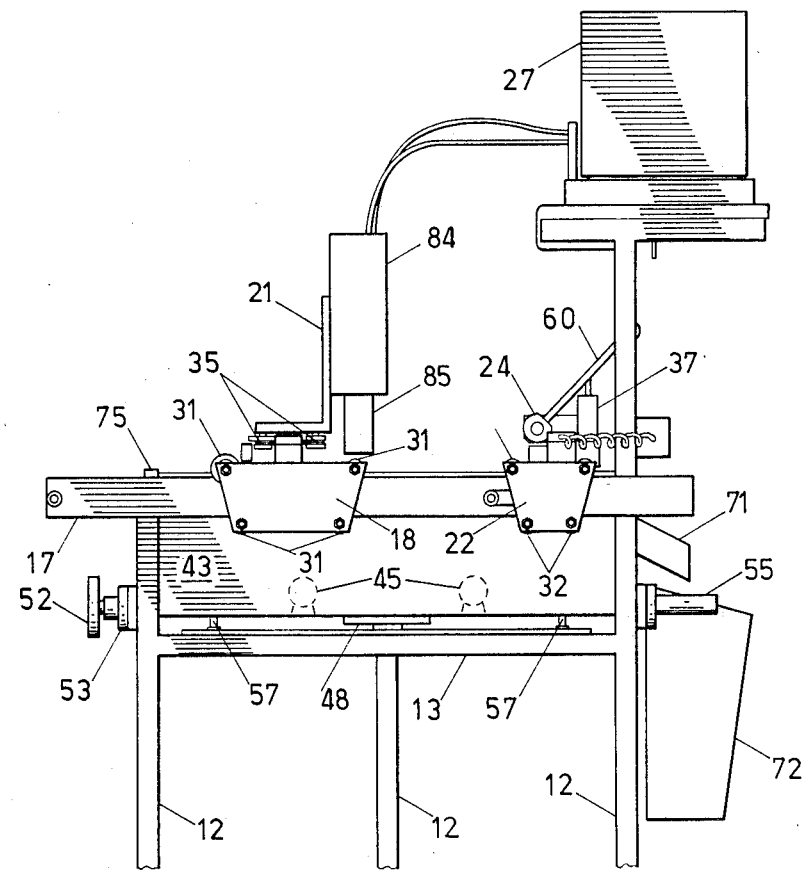
FIG. 3 is a side elevational view of the preparation table unit of FIG. 1.

The box-like support table 15 is formed of a front panel 39, side panels 43, a back panel (not shown), and a bottom wall 44 (shown in cross-section in FIG. 2). Fluorescent light fixtures 45 (illustratively shown in dashed lines in FIG. 3) are mounted to the bottom wall 44 and, when turned on by the operator by pressing the power switch 47 on the front panel, provide light which shines up through the translucent top surface 16 of the support table.

The support table 15 is mounted to the frame 11 for rotation about a vertical axis such that the top surface 16 always remains in a horizontal plane and thus always parallel to the cross bars 19 and 23 of the optical viewer carriage and the punch unit carriage, respectively. As shown in the cutaway view of FIG. 2, a bearing 48 is affixed by a bolt 49 to a central horizontal support member 13 with the bearing 48 also being mounted to the bottom wall 44 of the support table at substantially its center. The bearing 48 is constructed to support the table 15 so that the table surface 16 always remains in a horizontal plane and will not rock sideways, but the bearing permits the table to pivot about the vertical axis through the bearing. The rotational position of the table with respect to the frame is adjusted by means of a lead screw 51, turned by the operator using a pivot knob 52, which is threaded through a front support plate 53 attached to the upright frame members 12. The lead screw 51 has a rounded end which engages the front panel 39 of the support table near one corner such that the support table will be pushed inwardly by the lead screw 51 as the operator turns in the pivot knob 52. The table 15 is held in firm engagement with the lead screw 51 by the action of a spring loaded plunger 55 which is resiliently pressed against the back panel of the support table at the corner opposite that at which the lead screw 51 engages the table. Thus, rotation of the knob 52 to turn the lead screw 51 in and out will be followed by rotation of the table 15 as it is maintained in firm contact with the rounded end of the lead screw. To provide further support for the table 15, support bushings 57 may be mounted to the horizontal frame members 13 in a position with the tops of the bushings 57 in frictional contact with the bottom wall of the support table at spaced positions about the table.

Figure 4:
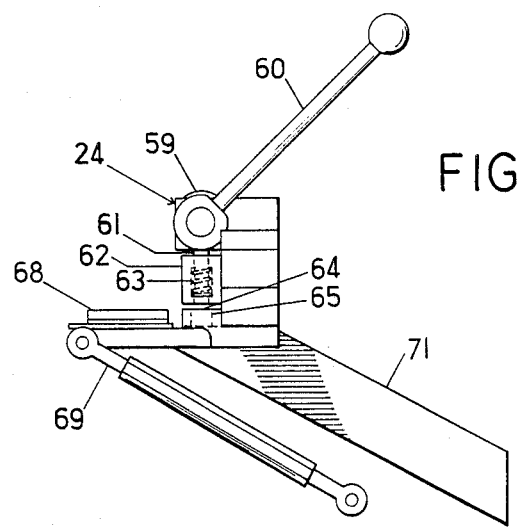
FIG. 4 is a partial side view of the punch unit portion of the preparation table unit.

The punch unit 24 has several individual round-hole punches 59 which are operated together by a cam turned by the operator by pulling on a lever 60. With reference to FIG. 4, each of the punch units has a plunger shaft 61 that extends downwardly through an opening in a support block 62, and each of the plungers 61 is urged upwardly by a spring 63 mounted within the openings in the block 62. The rotation of the lever 60 by the operator to turn the cam drives the plunger 61 downwardly against the force of the spring 63 until the sharp bottom edges of the plunger 61 extend through a gap 64 between the support block 62 and a lower die plate 65 which has openings therein spaced and sized to closely receive the ends of the plunger 61. A portion of a flexographic plate inserted into the slot 64 will thus have holes punched therein by the plungers 61 when they are driven downwardly into the plate under the force supplied by the operator on the lever 60. The plungers 61 are mounted in their support blocks 62 such that the holes that they punch in the plate will lie in a line which is precisely parallel to the punch unit cross bar 23 and, therefore, parallel to the optical viewer cross bar 19 and perpendicular to the side rails 17. The slot 64 lies at substantially the level of the surface 16 of the support table.

In ordinary utilization of the table, it is preferred that the plate be initially mounted away from the punch unit so that any motion of the plate when it rotates with the support table will not encounter interference from the punch unit 24 and to allow the optical viewer to read register marks at any position on the plate. Thus, a drop-out panel 68 is provided in the punch table surface 16 immediately in front of the punch unit 24. The drop out panel 68 is pivotally mounted at its ends to rods 69 which extend downwardly to connection to the frame members 12 (not shown in FIG. 4) such that the drop out panel 68 is pushed downwardly by cam action as the punch unit carriage 22 and the punch unit 24 are pulled forwardly by the operator. As illustrated in FIG. 4, and in the side view of FIG. 3, a chute 71 is mounted beneath the punch unit to collect the pieces punched out of the printing plates and deliver them to a collection receptacle 72.

In using the preparation table unit 10 to prepare a flexographic plate, the operator initially turns on the main power switch 47 to turn on the fluorescent lights 45 within the table and to activate the air pressure power units which are supplied with air pressure from a pump (not shown). The operator then adjusts the rotational position of the table 15 using the pivot knob 52 to recenter the table to a position wherein the edges of the table are substantially parallel to the frame members, and particularly to the side rails 17. A small pointer member 75 is preferably mounted to the frame and extends over the table at the front edge to aid the operator in performing this initial alignment of the table. The operator pushes the punch unit 24, carried on the cross bar 23, to the back of the table and turns on the switch 38 which activates the air cylinder locks 37. With reference to the view of FIG. 1, the drop out panel 68 preferably includes punch hole locator marks 76 indicating the position of the holes that would be punched by the punch unit 24. A locator line (not shown) may also be formed on the drop-out panel 68 which indicates the maximum depth of the slot 64 in the punch unit when the punch unit is in its fully forward position. The back of the flexographic plate to be laid on the table cannot extend beyond this locator line. Where opaque plates are to be punched, a clear plastic panel (not shown) with markings indicating the positions at which the holes will be punched can be pivotally mounted to the punch unit such that it can be rotated down to a position over the plate during initial positioning of the plate, and then flipped up out of the way when the plate is to be aligned and punched.

Figure 5:
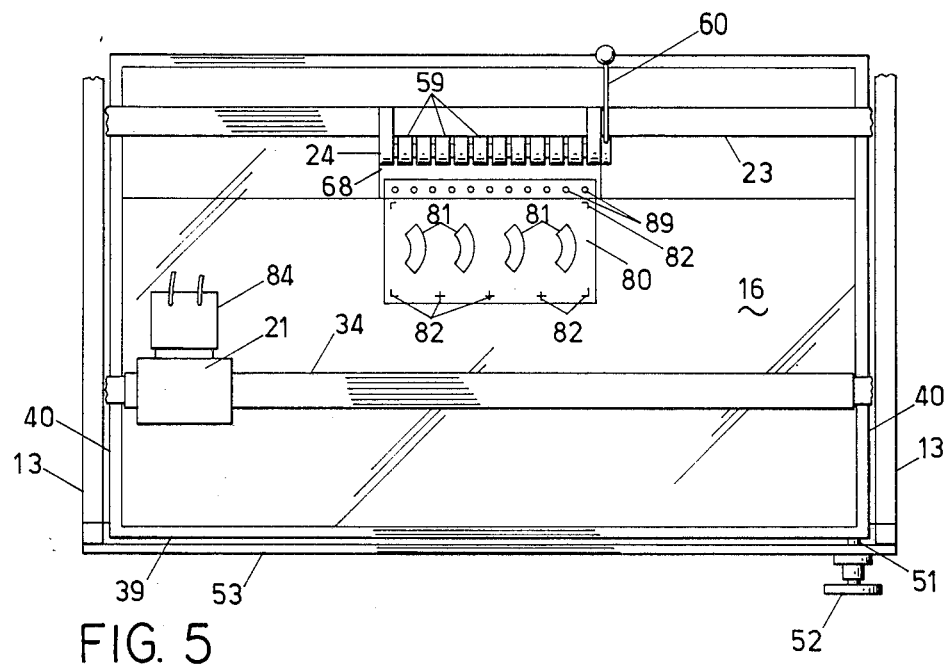
FIG. 5 is a top plan view of a portion of the preparation table unit of FIG. 1.

A flexographic printing plate 80 is shown in position on the table surface 16 in FIG. 5. For illustrative purposes, the plate 80 is shown with multiple raised images 81 formed thereon and with register marks 82 formed near the edges of the plate. In the preparation of the printing plate, the images 81 will be formed to lie along a major axis on which each of the images 81 is centered, and each image will be similarly aligned to a minor axis perpendicular to the major axis. The register marks 82 are each formed as lines parallel to these major and minor axes. The operator initially lays the plate 80 onto the surface 16 with a portion of the plate along one edge lying over the locator holes 76, but not beyond the locator line, at a position in which the locator holes are away from any of the printing images 81 on the plate. The operator can roughly position the plate in its proper position by squaring up the lower set of register marks 82 on the plate with the edge of the optical viewer support rail 34. With the plate in approximate parallelism, the operator then proceeds to tape down one side of the plate to the surface 16. The operator then preferably rechecks the position of the register marks with respect to the edge of the rail 34 and, if still accurate, now tapes down the other side of the plate to the support surface 16. To protect the plate, a ⅛ inch thick clear plexiglass cover sheet larger than the outside dimensions of the printing plate is preferably laid over the printing plate and the operator moves the optical viewer rail 34 and the viewer support 21 until the television camera 84 has its lens 85 over one of the register marks, preferably a mark at the extreme left or right edge of the plate.

Figure 6:
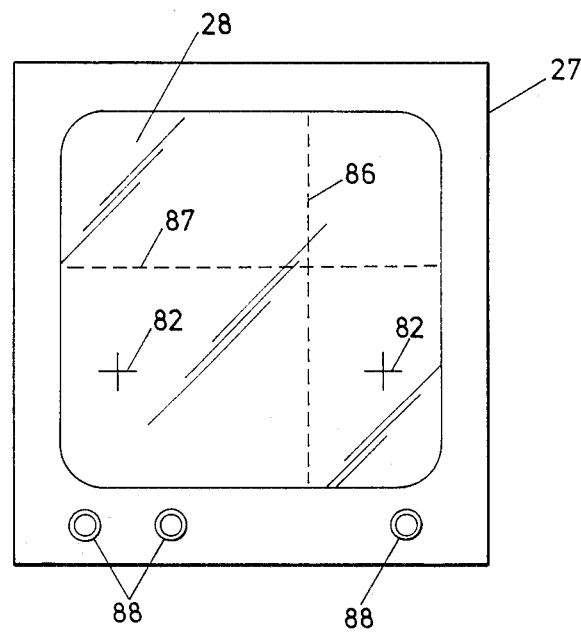
FIG. 6 is a view of the video display of the preparation table unit of FIG. 1 illustrating a typical view of a plate as seen by the optical viewer with sight marks projected thereon.

With reference to FIG. 6, the operator will observe on the screen 28 a register mark or marks 82 and a vertical sight mark (cross-line) 86 and perpendicular horizontal sight mark (cross-line) 87 projected on the screen by a program in the video display unit 27, which, for illustration, contains a cross-line generator. However, a separate cross-line generator unit (e.g., FOR-A Corporation Model IV 570) can be used with a video monitor (e.g., NEC FVM-95). The operator can adjust the focus and the position of the cross-lines using adjustment knobs 88 provided on the unit 27. The cross-lines 86 and 87 are preferably adjusted by the operator to be located at approximately the center of the screen 28 and the operator moves the camera 24 into position so that the cross-lines lie substantially directly over one of the register marks 82. The operator can then precisely align the vertical cross-line 86 to lie generally over the vertically extending line portion of the register mark 82 and similarly adjust the horizontal cross-line 87 to lie over the horizontally extending line portion of the register mark. The cross-line generator program within the video monitor causes the vertical cross line 86 to extend across the screen 28 in a direction which is precisely equivalent to a line parallel to the side rail 17, while the horizontal cross-line 87 is, of course, precisely perpendicular thereto. As an alternative to the utilization of the television camera 84 and the video monitor 27, it is possible to use a direct optical viewing lens mounted on the optical viewer support 21 which includes within it conventional cross-hairs which can be sighted by the operator. However, the television monitor system disclosed herein is preferred since it eliminates any errors in readings due to parallax and minimizes operator fatigue which may occur when the operator is required to use an optical microscrope system. With particular reference to the television monitor system shown in FIG. 6, the proper alignment of the plate is accomplished by the operator by turning the pivot knob 52 until the cross-lines 86 and 87 lie precisely over the vertical and horizontal line portions of a register mark 82. The operator then proceeds to move the camera 84 to a position over the next adjacent register mark and again positions the cross-lines 86 and 87 over the register mark and adjusts the rotational position of the table surface 16 with the pivot knob 52 until the cross-lines align precisely with the register mark. The operator then preferably will go back to the first mark and check to see that the cross-lines again line up precisely over the first register mark. If so, the remaining register marks should be checked for alignment with the cross-lines 86 and 87.

When all of the register marks are in alignment, the optical viewer rail 34 carrying the camera 84 is moved to the front of the table and the plexiglass cover sheet is removed from the printing plate. The toggle switch 38 is then switched to release the air cylinder locks and the punch unit bar is pulled forward which causes the drop-out panel 68 to move downwardly. The printing plate is guided into the slot 64 in the punch unit by the operator until the back edge of the plate is approximately at the back of the slot. At this point the toggle switch 38 is then turned to the on position to cause the air cylinders to lock the punch unit in position and the lever 60 is pulled forwardly by the operator to punch a series of holes in the plate at a position adjacent to one edge of the plate. After the holes are punched, the lever is moved back to its resting position, the toggle switch 38 is turned to the off position to release the air cylinder locks and the punch unit is moved back to its original position where it is again locked by turning on the toggle switch. The cover sheet is then removed from the plate and the plate is removed from the table and is ready for the mounting procedure.

The operation referred to above will thus produce a series of holes in the printing plate which lie in a line which is precisely parallel to either the major or the minor axis of the printing plate, i.e., precisely parallel or perpendicular to the axis of the images 81 formed on the plate. This row of holes can then be used to properly align the plate with respect to a printing cylinder.

Figure 7:
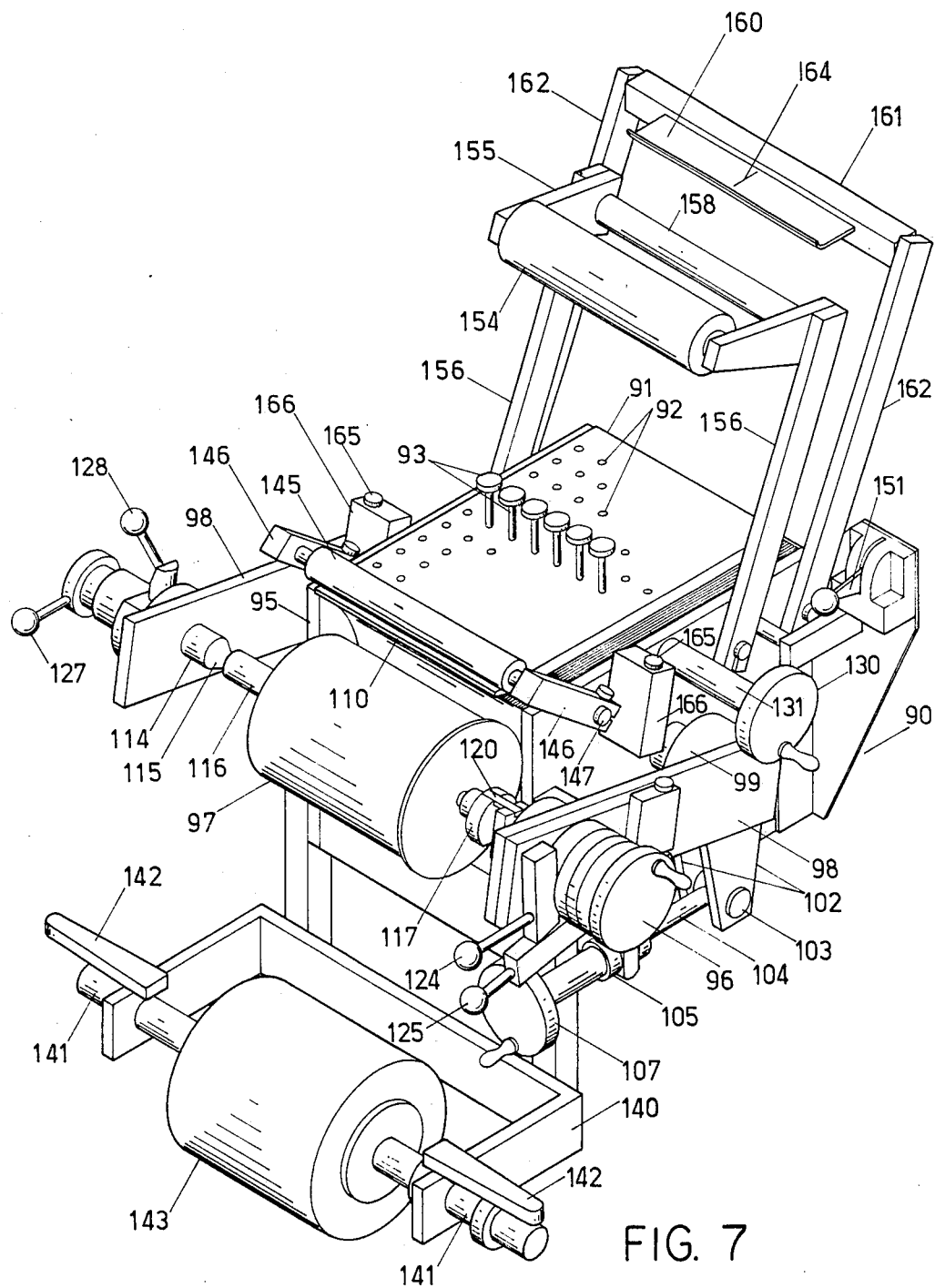
FIG. 7 is an isometric perspective view of the plate mounting unit of the invention.

After the flexographic printing plate has been prepared for mounting in the manner described above, it is transferred to the plate mounting unit which is shown generally at 90 in FIG. 7. The plate is layed upon the flat, horizontal surface of a mounting table 91 in the manner described further below. The table 91 has a rectangular array of rows and columns of holes 92 formed therein. A group of register pins 93 are provided with the plate mounter and are constructed to fit tightly within the openings 92, extending partially down into the bores of these holes. The pins also fit snugly but without binding in the holes 89 which have been punched in the printing plate 80 during the preparation process described above. Several of these pins are shown emplaced in a row of holes in the view of FIG. 7, although it should be noted that these pins would generally be removed from the surface of the mounting table 91 before the plate is initially laid on the surface of the table.

The table 91 is mounted to a frame having side panels 95. As described below, the mounting of the table 91 allows it to be moved laterally—that is, toward one or the other of the side panels 95—while the surface of the table is always maintained in the same plane. An arbor 96 for holding a plate cylinder 97 is also mounted to the frame panels 95. The arbor 96 includes a pair of lever arms 98 which are each attached near one end to a clamp 99 connected to a shaft 100 which passes through the side plates 95 and is journaled thereto to allow pivoting of the arms 98, and therefore the entire arbor 96, about a horizontal axis. The axis of pivoting defined by the shaft 100 is parallel to the top surface of the mounting table 91 and is also parallel to the rows of holes 92 in the table surface. A pair of pivot arms 102 are rigidly connected to one clamp 99 and extend downwardly therefrom where they are connected by a pivot 103 to a jackscrew shaft 104. The jackscrew 104 is threaded through a collar 105 which is mounted on the end of a shaft 106 journaled to the side panels 95 of the frame, and the end of the shaft 104 is connected to a crank wheel 107 which is positioned where it can be easily reached by the operator. Thus, when the operator rotates the crank 107, the jack shaft 104 will advance forwardly or backwardly, depending on its direction of rotation, and will drive the pivot arms 102 forwardly or backwardly, thereby pivoting the arms 98 of the arbor up or down and bringing the arbor 96 and a plate cylinder 97 held therein either closer to or further away from the front edge 110 of the table 91.

Figure 8:
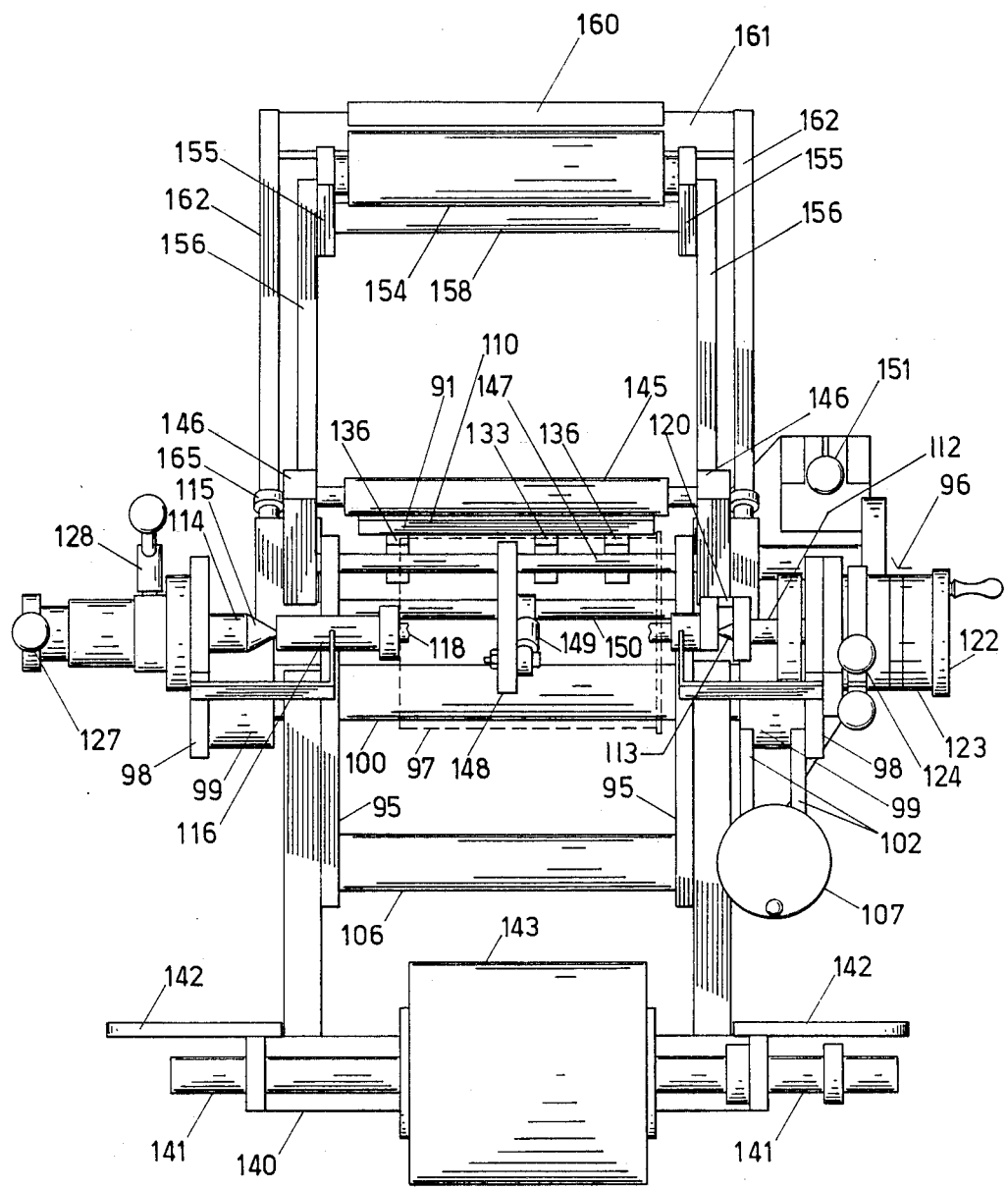
FIG. 8 is front elevational view of the plate mounting unit of FIG. 7.
Figure 9:
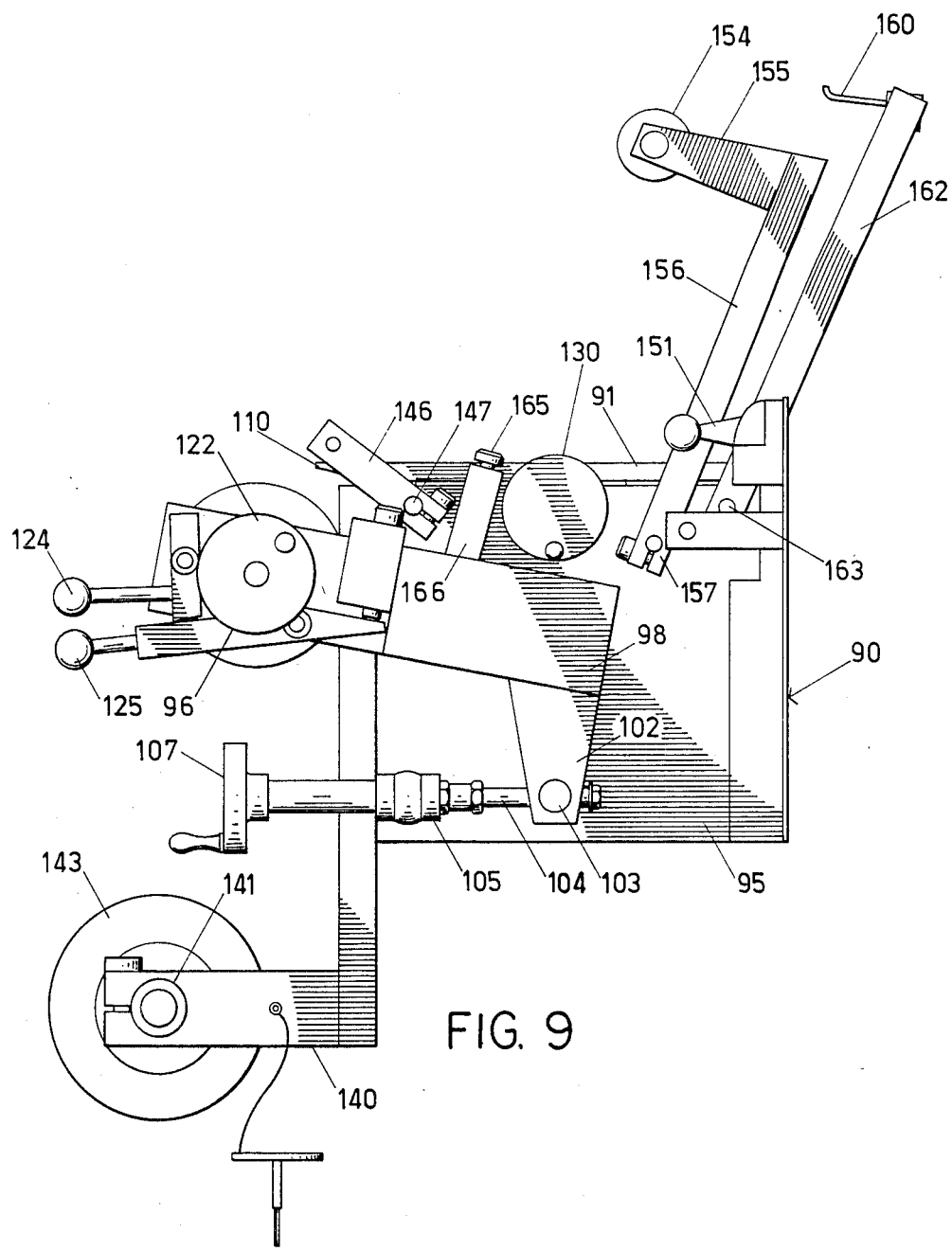
FIG. 9 is a side elevational view of the plate mounting unit of FIG. 7.

As best shown in FIG. 8, the arbor 96 has a pair of opposed chucks 112 and 114 having sharply pointed conical inner ends 113 and 115, respectively. The conical points 113 and 115 of the chucks face each other on a line which is always parallel to the surface of the table 91 and parallel to the rows of holes 92 in the table, and this parallelism is maintained as the arbor is pivoted inwardly toward the table or outwardly away from the table. The conical pointed ends 113 and 115 of the chucks are adapted to fit into central conical depressions (not shown) in holding shaft brackets 116 and 117 which are attached to the two ends of the plate cylinder shaft 118 (partially shown in FIG. 8). By mounting the plate cylinder (the position of which is indicated by the dashed line labeled 97 in FIG. 8) on the conically tipped chucks 112 and 114, the axis of rotation of the plate cylinder will be precisely located on a line extending between the points of the conical tips 113 and 115, and thus the axis of rotation of the plate cylinder will be maintained parallel to the surface of the mounting table 91 and parallel to any row of holes 92 in the table, and, thereby also perpendicular to any column of holes 92. Assuming that the plate cylinder has, in fact, a true cylindrical surface, any longitudinal line about the surface will be parallel to the surface of the mounting table, and any imagined plane containing a circumferential line about the plate cylinder surface will be perpendicular to the plane of the table and parallel to the columns of holes in the table. Thus, the orientation of the plate cylinder with respect to the mounting table and the holes 92 therein is precisely established for any position of the arbor 96 as it is pivoted.

To restrain the plate cylinder 97 when mounted in the arbor from rotational movement and to precisely define its rotational position, a lug 120 extends from the chuck 112 toward the plate cylinder and is received in a groove (not shown in FIG. 8) in a flange portion of the holding bracket 117 at a position spaced radially away from the depression in which the tip 113 is received so that the plate cylinder will be held in constant position with respect to the rotational position of the chuck 112. The shaft of the chuck 112 is connected to an indexer crank 122 which can be rotated by the operator to thereby rotate the plate cylinder about its axis. Vernier indicia are preferably formed on the body 123 of the indexer to allow the rotational position of the indexer and the plate cylinder to be determined by the operator. A lock-out arm 124 is provided on the indexer to normally lock the indexer in a specific rotational position while allowing the operator to depress the arm 124 and release the indexer so that the indexer and the plate cylinder can be rotated. A spring loaded quick indexing arm 125 is also provided to allow small rotations of the indexer when the arm 125 is depressed. The chuck 114 can be moved outwardly to release the plate cylinder 97 by rotation of a lever 127 by the operator which is connected to the chuck 114. A cam surface (not shown) causes the shaft 114 to move outwardly as the lever 127 is depressed, and the chuck may be urged back to its inward position by a spring (not shown). A second lever 128 is connected to a screw shaft which can be turned by the lever 128 into engagement with the chuck shaft 114 to hold the same in position.

Figure 10:
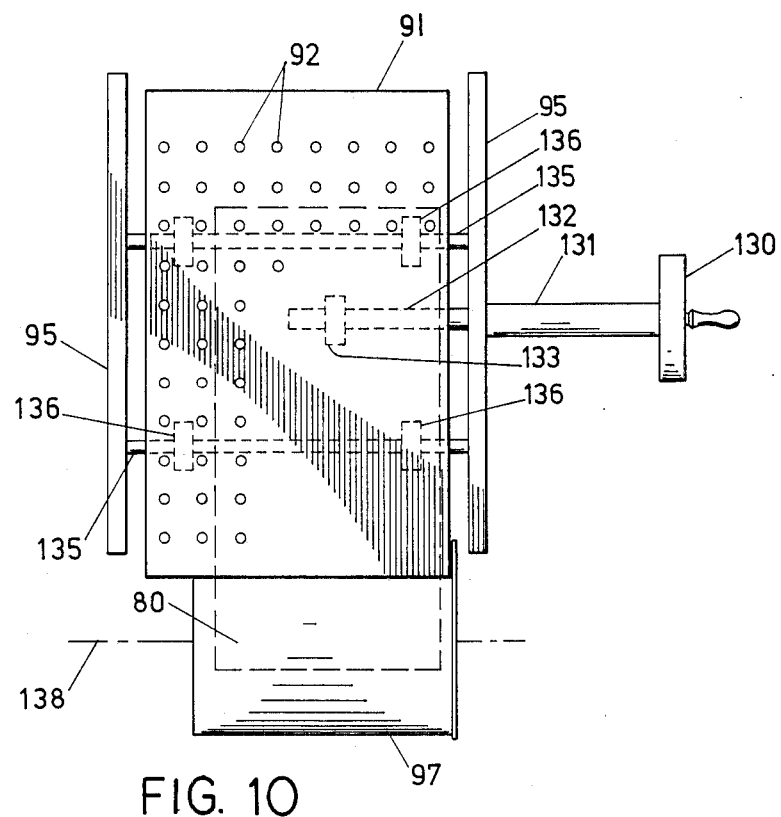
FIG. 10 is a simplified top plan view of the mounting table portion of the plate mounting unit of FIG. 7 shown in relation to a plate cylinder.

As noted above, the table 91 is preferably mounted for lateral motion, i.e., motion parallel to the axis of the plate cylinder 97, so that the table can be positioned precisely with respect to the surface of the plate cylinder. To allow the operator to adjust the lateral position of the table 91, a hand crank 130 is provided at the side of the mounter. A collar 131 mounted to one side plate 95 receives a jack screw shaft 132 which is attached to the center of the crank 130. The mounting of the table is best shown with reference to the simplified top view of FIG. 10. The threads of the jack screw shaft 132, shown in dashed lines in FIG. 10, are engaged with internal threads in a bracket 133 which is mounted to the bottom of the table 91. The collar 131 allows the shaft 132 to be rotated freely. Smooth circular shafts 135 are mounted to and between the side plates 95 and pass through bushings in brackets 136 which are mounted to the bottom of the table 91. The table 91 can thus slide smoothly in either lateral direction supported on the shafts 135, with the precise lateral position of the table being adjusted by the operator by rotating the crank 135 until the table reaches the desired position. The shafts 135 are mounted parallel to the axis of rotation 138 of the plate cylinder 97, which has been defined by the intersection of the points of the chucks 112 and 114, so that at any particular lateral position of the table the rows of holes will always be parallel to the axis 138 and the columns of holes 92 will always be perpendicular to the axis 138. The typical position of a flexographic plate when layed on the table 91 is illustrated by the dashed line labeled 80 in FIG. 10. A U-shaped bracket 140 is attached to the frame of the mounter 90 at a position in front of and below the plate cylinder 97 and supports a mounting shaft 141 that extends between the bracket's free ends, and a pair of levers 142 are mounted to the bracket at each end which can be turned to engage or disengage the shaft 141. The shaft 141 supports a roll of double-sided adhesive paper 143, commonly called "sticky-back", at a position below the plate cylinder 97. The particular roll of adhesive paper 143 is selected to be of substantially the same width as the lateral width of the plate cylinder on which a plate is being mounted. When the levers 142 are turned to their open position, the shaft 141 can be removed from the bracket 140 to allow the roll of adhesive paper 143 to be replaced.

A small rubber covered pressure roller 145 is mounted for rotation to and between arms 146 which are themselves connected at their opposite ends to a shaft 147. The roller 145 is positioned to advance into contact with the surface of the table 91 at a position near its front edge 110. As best shown in FIG. 8, the shaft 147 is journaled between the side plates 95 and is rigidly connected at one end to a link 148. An air pressure drive cylinder 149 is pivotally connected to one end of the link 148 and is connected at its other end to a shaft 150 which is mounted to and extends between the side plates 95. The double acting air cylinder 149 is controlled by a lever 151 to operate a valve (not shown) which directs air under pressure to one side or the other of the piston within the cylinder 149. In one position of the lever 151, the air cylinder 149 is retracted to move the link 148 inwardly, thereby rotating the shaft 147 and causing the pressure roller 145 to be pressed against the surface of the table 91 and, specifically, pressing a plate mounted on the table firmly against the surface of the table. However, since the roller 145 is mounted for rotation to the arms 146, a plate laid on the table 91 and held thereon by the pressure of the roller 145 can be pulled outwardly as the roller 145 rotates. The turning of the lever 151 to its opposite position by the operator causes the air cylinder 149 to advance, resulting in the roller 145 being driven away from the table surface so that a plate can be easily laid in position on the table surface without interference by the roller 145.

Another larger pressure roller 154, preferably made of relatively hard rubber, is journaled for rotation between support arms 155 which are rigidly mounted at their other ends to extending arms 156 which are attached at their opposite ends to a shaft 157 which is journaled for rotation to the side plates 95. A shaft 158 extends between the arms 156 and is held by the operator to move the roller 154 downwardly toward the surface of the plate cylinder 97 or upwardly into the position shown in FIG. 7. The length of the arms 156 is selected such that the surface of the roller 154 will contact the top surface of the plate cylinder 97 held within the chucks 112 and 114 at a position substantially at the top of the plate cylinder. The roller 154 is thus also mounted such that its axis of rotation is parallel to the axis of rotation of the cylinder 97, such that the surfaces of the roller 154 and the surface of the plate cylinder 97 will be parallel and will smoothly and uniformly engage one another.

A guide plate 160 having a straight front edge is mounted to a bar 161 which extends between side arms 162 which are themselves connected at their opposite ends to a shaft 163 journaled to the side plates 95 for rotation. The side arms 162 are mounted in a position spaced outwardly of the side arms 156 that support the pressure roller 154 and are longer so that the guide plate 160 can be rotated downwardly toward the surface of the plate cylinder 97 without interference from the pressure roller 154 or its supporting side arms 156. The front edge of the guide plate 160 is parallel to the axis of rotation of the plate cylinder 97, and thereby parallel to a longitudinal line on its surface, and is positioned so that the front edge will engage the surface of the plate cylinder at a position forward of that at which the roller 154 will meet the plate cylinder surface. A scribe line 164 is preferably marked on the front surface of the guide plate 160 at a position corresponding substantially to the middle of the plate cylinder surface to aid in positioning of the plate laterally with respect to the plate cylinder, as described below. To control the force of contact of the front edge of the guide plate 160 with the surface of the plate cylinder, or with a plate mounted thereon, the heads of spring biased plunger units 165 are preferably mounted on either side of the side plates 95 in position to engage the side arms 162 and resiliently oppose further motion of the guide plate 160 downwardly when the front edge of the guide plate is just above the surface of the plate cylinder 97.

Figure 11:
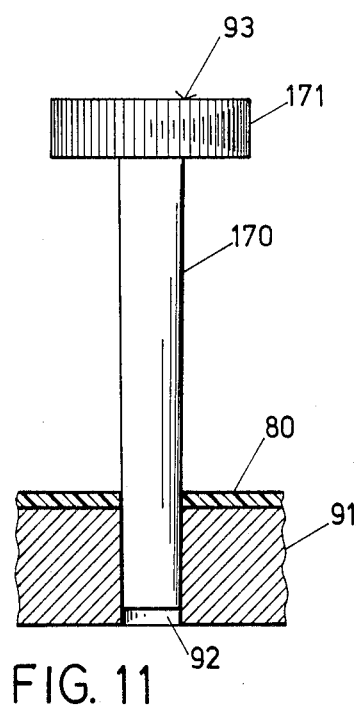
FIG. 11 is an illustrative view of a register pin in position in the mounting table holding a printing plate thereon.

An exemplary register pin 93 is shown in position in one of the holes 92 in FIG. 11. As shown, the pin 93 preferably has a smooth shaft 170 of circular cross-section but tapering slightly from its knurled head 171 to its free tip. The holes 92 in the mounting table 91 are also preferably tapered slightly to match the taper of the shafts 170. Thus, when a pin 93 is inserted into a hole 92, the pin will pass freely into the hole for a short distance and then will tightly engage the walls of the hole 92. In the mounting of the pins, the operator may slightly twist and push the pins 93 into the holes so that a very tight and positionally well-defined engagement of the shafts 170 with the walls of the holes 92 is obtained. As also illustrated in FIG. 11, the shaft 170 of the pin preferably is substantially the same size as the holes in the printing plate 80 so that the plate is tightly held in position by the pin.

In preparation for the mounting of a plate to the plate cylinder, all of the pins 93 are removed from the table 91. The cylinder 97 is mounted by the operator in the holding shaft brackets 116 and 117 and the lever 127 is turned by the operator to allow the cylinder held by the mounting brackets 116 and 117 to be mounted in place, after which the lever 127 is released to engage the conical tips 115 and 113 of the chucks into the respective conical depressions in the holding brackets. The position of the chuck 114 is fixed by tightening the lever 128 and the drive lug 120 is engaged in the groove of the mounting bracket 117 to fix the position of the plate cylinder 97 with respect to the indexer 96. The operator then uses the crank 107 to adjust the height of the cylinder in the mounter, that is, to rotate the cylinder 97 up to a position wherein its surface is adjacent to the front edge 110 of the table 91. A roll of double-sided adhesive 143 of the proper size is also placed in position by the operator beneath the plate cylinder 97.

The crank 122 of the indexer 96 is then turned by the operator until the indicia on the body 123 of the indexer indicate the zero rotational position and the indexer is then locked. The operator then removes the front edge of the adhesive paper from the roll and draws it up to meet with the cylinder surface. The indexer lockout arm 124 is engaged for lockout and the crank 122 is used to turn the cylinder to roll the double-backed adhesive onto the plate cylinder surface. The indexer is turned until it reaches the zero rotational position and the arm 124 is released and locked in; the guide plate 160 is then pressed down onto the surface of the adhesive paper on the plate cylinder and is used as a straight edge to guide a knife which cuts across the adhesive paper. The guide plate is then moved to its initial position and the large pressure roller 154 is drawn downwardly into engagement with the adhesive paper (covered by a backing) on the surface of the cylinder, the arm 124 is engaged for lockout, and the indexer crank is turned while the roller 154 presses the adhesive paper to smooth it out and adhere it firmly to the cylinder surface. The operator then switches the lever 151 to cause the pressure roller 145 to be driven away from contact with the mounting table surface. With reference to FIG. 10, the punched and prepared plate 80 is laid on the table so that a portion of the plate lays over the top of the plate cylinder 97. The holes in the plate are then aligned with either a row or column of holes 92 in the table surface, depending upon whether the holes in the plate were punched at the top of the plate or along one of its sides. Several of the pins 93 are inserted through the holes in the plate into the holes 92 in the mounting table surface to fix the plate 80 firmly in place on the table. Of course, it is noted that the holes that have been punched in the plate 80 in the manner described above are sized and spaced to exactly coincide with the holes 92 formed in the mounting table. The guide plate 160 may then be brought down into a position adjacent to the plate 80 as it extends over the plate cylinder surface, and the plate can be precisely centered on the cylinder surface, if desired, by aligning a center line which has been scribed or drawn onto the plate with the center line scribe mark 164 on the guide plate, which corresponds to the center of the plate cylinder surface. The operator can adjust the lateral position of the plate by turning the crank 130 to move the plate one way or the other until the center line on the plate coincides with the scribe line 164 on the guide plate.

After the plate has been centered, the operator switches the lever 151 to clamp the roller 145 tightly down onto the plate 80, thereby holding it firmly against the top surface of the table 91. The protective cover sheet which is provided on the double-backed adhesive paper on the plate cylinder surface can then be removed by the operator to expose the paper's tacky surface. At this point, it is preferred that the rotational position of the plate cylinder be adjusted so that the seam between the two ends of the adhesive paper on the plate cylinder does not substantially lie under the edge of the printing plate. For example, this can be accomplished by loosening the holding shaft bracket 116 and rotating the plate cylinder. When the position of the plate cylinder has been properly adjusted, the front edge of the plate 80 is pressed evenly down onto the adhesive paper on the cylinder surface. The pins 93 are then removed from the plate by carefully twisting them out of the holes without pulling the plate from the mounting table surface. The operator then brings the large pressure roller 154 downwardly into engagement with the plate to press the same against the adhesive on the cylinder surface and engages the indexer lockout arm 124 so that the indexer crank 122 can be turned to wind the plate 80 onto the plate cylinder 97 with a steady rotational motion under the pressure of the roller 154.

The proper repeat of images on the mounted plate can be checked using the indexer 122 and the edge of the guide plate 160 by rotating the plate cylinder precisely 360° and noting if the same spot on the plate is under the edge of guide plate 160 after each such complete rotation. If the repeat of the mounted plate 80 is correct, the plate cylinder 97 may be removed by rotating the arm 127 to allow the plate cylinder to move free of the arbor and the holding shaft brackets 116 and 117 may then be removed from the shaft of the plate cylinder. The cylinder is now ready for mounting in a printing press with a minimal amount of on-press make ready time being required. The on-press adjustments are minimized since the mounting procedures described above result in the images on the plate aligned so that their longitudinal axes are in precise alignment with a circumferential line about the plate cylinder, and the images are positioned so that accurate repeat of the images for each revolution of the plate cylinder will occur.

It is apparent that other means may be used to mount the punched plate to the mounting table. For example, although multiple rows and columns of holes 92 are preferred, a single row or column of holes could suffice for a limited range of plate sizes. Of course, as few as two pins 93 may be utilized to hold the plate during mounting, as two pins fixed in holes in the plate and in the mounting table will uniquely define a straight line. Although not preferred, pins fixed in rows and/or columns on the table could be utilized, with the pins being inserted into the holes in the punched plate as the plate is laid on the table surface. Once held by the action of the pressure roller 145, the plate could be lifted off the pins to allow it to be drawn onto the plate cylinder surface.

It is understood that the invention is not confined to the particular construction and arrangement of parts herein illustrated and described, but embraces such modified forms thereof as come within the scope of the following claims.

What is claimed is:

1. Apparatus for use in preparing a flexographic printing plate for mounting in proper alignment with a plate cylinder, comprising:
   (a) a frame;
   (b) a support table with a flat top surface which is mounted to the frame for rotation about an axis perpendicular to the top surface;
   (c) means for adjusting the rotational position of the support table with respect to the frame;
   (d) optical viewer means for displaying a portion of the area of the support table surface to an operator and providing sight marks in the display to the operator whereby the operator can compare the orientation of the sight marks to register marks on a printing plate supported on the top surface of the table beneath the optical viewer means; and
   (e) punch means selectively operable by the operator for punching a series of spaced holes in a flexographic printing plate supported on the table top surface at a selected location such that the punch means remains fixed with respect to the optical viewer means and the frame, and thereby with respect to the sight marks displayed to the operator by the optical viewer means, as the rotational position of the support table is adjusted.

2. The apparatus of claim 1 wherein the top surface of the support table is translucent and wherein the support table includes lighting fixtures mounted beneath the top surface to project light therethrough.

3. The apparatus of claim 1 wherein the optical viewer means includes a television camera mounted above the support table which is directed to view a portion of the top surface thereof and a video display means for displaying the picture recorded by the television camera on a video screen and for projecting vertical and horizontal sight marks on the video screen which are superimposed on the image of the surface as viewed by the television camera.

4. The apparatus of claim 1 including optical viewer support means for supporting the optical viewer means above the support table surface for movement thereof in any direction in a plane parallel to the support table surface, while maintaining the orientation of the optical viewer means with respect to the punch means.

5. The apparatus of claim 4 wherein the frame includes a pair of side rails mounted at positions spaced outwardly of the sides of the support table and parallel to one another, and wherein the optical viewer support means includes carriages having rollers which engage each of the side rails, a cross bar extending above and parallel to the top surface of the support table and supported by the carriages which roll on the side rails, an elongated rail attached to the top of the cross bar, and rollers which mount the optical viewer means to the elongated rail to allow sliding back and forth movement of the optical viewer means on the elongated rail, whereby the optical viewer means can be moved in any direction by moving the cross bar as supported on the side rails and moving the optical viewer means on the cross bar.

6. The apparatus of claim 1 wherein the means for adjusting the rotational position of the support table includes a pivot knob which is rotatable by the operator, a lead screw connected to the pivot knob and mounted to the support table which is positioned to engage the support table near a corner thereof, and a spring-loaded plunger which is resiliently pressed against the support table at a corner thereof opposite that at which the lead screw engages the table.

7. The apparatus of claim 1 wherein the punch means includes a plurality of round hole punches in a line which are operated together by a cam turned by the operator by pulling on a lever and including support means for supporting the punch means at a position above the support table for movement forwards and backwards while maintaining the orientation of the line of holes punched by the punches in a fixed relationship with the optical viewer means.

8. The apparatus of claim 7 wherein the frame includes a pair of parallel side rails mounted at positions at the sides of the support table and wherein the support means for the punches includes carriages having rollers engaging the side rails to allow movement back and forth thereon and a cross bar extending between the carriages which supports the punches, and wherein the table includes a drop-out panel provided in the top surface thereof immediately in front of the punches which is pivotally mounted to allow the drop-out panel to be pushed downwardly as the cross bar supporting the punches is drawn forwardly by the operator.

9. The apparatus of claim 1 wherein the support table is formed as a generally rectangular box having a translucent material defining the top surface and a bottom panel having a bearing mounted thereto at substantially the center thereof, the bearing being connected to the frame to allow rotation of the support table about an axis through the bearing which is perpendicular to the top surface.

10. Apparatus for use in preparing a flexographic printing plate for mounting in proper alignment with a plate cylinder, comprising:
 (a) a frame including a pair of parallel side rails;
 (b) a support table with a flat top surface which is mounted to the frame in a position between the parallel side rails for rotation about an axis perpendicular to the top surface, the table including a drop-out panel in the top surface thereof which is pivotally mounted to allow the drop-out panel to be pushed downwardly;
 (c) means for adjusting the rotational position of the support table with respect to the frame;
 (d) optical viewer means for displaying a portion of the area of the support table surface to an operator and providing sight marks in the display to the operator whereby the operator can compare the orientation of the sight marks to register marks on a printing plate supported on the top surface of the table beneath the optical viewer means;
 (e) punch means selectively operable by the operator for punching a series of spaced holes in a flexographic printing plate supported on the table top surface at a selected location such that the locus of the holes punched is in a determined geometric relationship with the optical viewere means, the punch means including a plurality of round hole punches which are operated together by a cam turned by the operator by pulling on a lever; and
 (f) support means for supporting the punch unit at a position above the support table for movement forwards and backwards while maintaining the orientation of the line of holes punched by the punches in a fixed relationship with the optical view means, the support means for the punches including carriages having rollers engaging the side rails to allow movement back and forth thereon and a cross bar extending between the carriages which supports the punches, and wherein the drop-out panel is located immediately in front of the punches and is mounted to be pushed downwardly as the cross bar supporting the punches is drawn forwardly by the operator.

11. Apparatus for use in preparing a flexographic printing plate for mounting in proper alignment with a plate cylinder, comprising:
 (a) a frame;
 (b) a support table with a flat top surface which is mounted to the frame for rotation about an axis perpendicular to the top surface;
 (c) means for adjusting the rotational position of the support table with respect to the frame;
 (d) optical viewer means for displaying a portion of the area of the support table surface to an operator and providing sight marks in the display to the operator whereby the operator can compare the orientation of the sight marks to register marks on a printing plate supported on the top surface of the table beneath the optical viewer means;
 (e) optical viewer support means for supporting the optical viewer means above the support table surface for movement thereof in any direction in a plane parallel to the support table surface while maintaining a fixed orientation of the optical viewer means with respect to the frame;
 (f) punch means selectively operable by the operator for punching spaced holes in a line in a flexographic printing plate supported on the table top surface at a selected location; and
 (g) support means for supporting the punch means such that the line of holes to be punched by the punch means remains in a fixed orientation with the optical viewer means and the sight marks displayed to the operator by the optical viewer means at any position at which the optical viewer means may be supported over the support table and at any rotational position of the support table.

12. The apparatus of claim 11 wherein the optical viewer means displays orthogonal sight reference lines to an operator which are superimposed on the image of the plate on the surface of the support table which is seen by the operator, and wherein the line of the holes punched by the punch means is always parallel to one of the sight reference lines as the observer sees it superimposed on the image of the plate.

13. The apparatus of claim 11 wherein the top surface of the support table is translucent and wherein the support table includes lighting fixtures mounted beneath the top surface to project light therethrough.

14. The apparatus of claim 11 wherein the optical viewer means includes a television camera mounted above the support table which is directed to view a portion of the top surface thereof and a video display means for displaying the picture recorded by the television camera on a video screen and for projecting vertical and horizontal sight marks on the video screen which are superimposed on the image of the surface as viewed by the television camera.

15. The apparatus of claim 11 wherein the frame includes a pair of side rails mounted at positions spaced outwardly of the sides of the support table and parallel to one another, and wherein the optical viewer support means includes carriages having rollers which engage each of the side rails, a cross bar extending above and parallel to the top surface of the support table and supported by the carriages which roll on the side rails, an elongated rail attached to the top of the cross bar, and rollers which mount the optical viewer means to the elongated rail to allow sliding back and forth movement of the optical viewer means on the elongated rail, whereby the optical viewer means can be moved in any direction by moving the cross bar as supported on the side rails and moving the optical viewer means on the cross bar.

16. The apparatus of claim 11 wherein the means for adjusting the rotational position of the support table includes a pivot knob which is rotatable by the operator, a lead screw connected to the pivot knob and mounted to the support table which is positioned to engage the support table near a corner thereof, and a spring-loaded plunger which is resiliently pressed against the support table at a corner thereof opposite that at which the lead screw engages the table.

17. The apparatus of claim 11 wherein the punch means includes a plurality of round hole punches in a line which are operated together by a cam turned by the operator by pulling on a lever and wherein the support means for the punch means supports the punches at a position above the support table for movement forwards and backwards while maintaining the orientation of the line of holes punched by the punches in a fixed relationship with the optical viewer means.

18. The apparatus of claim 17 wherein the frame includes a pair of parallel side rails mounted at positions at the sides of the support table and wherein the support means for the punches includes carriages having rollers engaging the side rails to allow movement back and forth thereon and a cross bar extending between the carriages which supports the punches, and wherein the table includes a drop-out panel provided in the top surface thereof immediately in front of the punches which is pivotally mounted to allow the drop-out panel to be pushed downwardly as the cross-bar supporting the punches is drawn forwardly by the operator.

19. The apparatus of claim 11 wherein the support table is formed as a generally rectangular box having a translucent material defining the top surface and a bottom panel having a bearing mounted thereto at substantially the center thereof, the bearing being connected to the frame to allow rotation of the support table about an axis through the bearing which is perpendicular to the top surface.

* * * * *